United States Patent
Chuo et al.

(10) Patent No.: US 9,313,890 B2
(45) Date of Patent: Apr. 12, 2016

(54) ATTENUATION REDUCTION STRUCTURE FOR HIGH FREQUENCY SIGNAL CONTACT PADS OF CIRCUIT BOARD

(71) Applicant: ADVANCED FLEXIBLE CIRCUITS CO., LTD., Taoyuan County (TW)

(72) Inventors: Chih-Heng Chuo, Taoyuan County (TW); Kuo-Fu Su, Taoyuan County (TW); Gwun-Jin Lin, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 70 days.

(21) Appl. No.: 14/478,322

(22) Filed: Sep. 5, 2014

(65) Prior Publication Data

US 2015/0102874 A1 Apr. 16, 2015

(30) Foreign Application Priority Data

Oct. 11, 2013 (TW) .............................. 102136663 A (51) Int. Cl.
*H05K 1/02* (2006.01)
*H05K 1/11* (2006.01)

(52) U.S. Cl.
CPC .............. *H05K 1/118* (2013.01); *H05K 1/024* (2013.01); *H05K 1/025* (2013.01); *H05K 1/117* (2013.01); *H05K 2201/0191* (2013.01)

(58) Field of Classification Search
CPC ... H05K 1/0224; H05K 1/0242; H05K 1/028; H05K 1/0306

USPC ......... 333/12, 81 R–81 B; 439/108, 492, 497
See application file for complete search history.

(56) References Cited

U.S. PATENT DOCUMENTS

| | | | | |
|---|---|---|---|---|
| 7,351,096 | B2 * | 4/2008 | Kondou | H01R 24/44 439/494 |
| 8,313,342 | B2 * | 11/2012 | Lin | H01R 12/775 174/254 |
| 2002/0126951 | A1 * | 9/2002 | Sutherland | H05K 1/0253 385/24 |
| 2014/0318833 | A1 * | 10/2014 | Tien | H05K 1/0253 174/254 |

* cited by examiner

*Primary Examiner* — Dean Takaoka
*Assistant Examiner* — Alan Wong
(74) *Attorney, Agent, or Firm* — Rosenberg, Klein & Lee (57) ABSTRACT

An attenuation reduction structure of a circuit board includes an expanded thickness formed between high frequency signal contact pads and a grounding layer of the circuit board. The expanded thickness is greater than a reference thickness between the grounding layer and high frequency signal lines. The circuit board is made of polyethylene terephthalate (PET) or polyimide (PI). Alternatively, a rigid board including resin and fibrous material or a rigid-flex board is used. The circuit board can be a single-layer circuit board or a multi-layer board formed by combining at least two single-layer circuit boards. A thickness-expanding pad is mounted between the high frequency signal contact pads and the grounding layer or the thickness of a portion of a bonding layer of the circuit board is increased to provide an expanded thickness.

14 Claims, 10 Drawing Sheets

ATTENUATION REDUCTION STRUCTURE FOR HIGH FREQUENCY SIGNAL CONTACT PADS OF CIRCUIT BOARD

BACKGROUND OF THE INVENTION

1. Field of the Invention

The present invention relates to a structure of a circuit board that improves transmission quality of high frequency signals, and in particular to an attenuation reduction structure for high frequency signal contact pads of the circuit board, which includes an expanded thickness between a contact pad mounting zone and a grounding layer of a substrate to reduce a capacitance effect between the high frequency signal contact pads and the grounding layer so as to reduce attenuation occurring in the transmission of high frequency signals.

2. The Related Arts

In all sorts of electronic device that are currently available and used, the amount of data transmitting through signal lines is increasingly expanding and consequently, the number of signal transmission lines needed is constantly increased and the frequencies used to transmit signals are also constantly raised.

A number of ways are used to suppress the generation of noises in high frequency signal lines. A common mode chock is commonly used in the known circuits to suppress common mode noises, but it is not fit for applications of circuit boards of high speed/high frequency signals.

In the high frequency signal transmission technology, generally, two high frequency signal lines are grouped as a signal pair to respectively transmit signals of identical amplitudes but opposite phases. Common mode noises that are induced by external interference signals in the two signal lines are of identical amplitudes and identical phases and would be rejected by a differential input pair of an integrated circuit so that the circuit shows a better effect of suppressing electromagnetic interference.

Although the known high frequency signal transmission technology is effective in remarkably alleviating potential problems occurring in the transmission of signals, yet poor designs may result in potential problems in actual applications, such as signal reflection, radiation of electromagnetic signals, loss of transmitted signals, and distortion of waveforms of signals. Specifically, for flexible circuit boards having a substrate that includes a reduced thickness, these problems associated with signal transmission get even worse. Causes for such problems include for example poor match of characteristic impedance in a length extension direction of high frequency signal lines, poor control of additional parasitic capacitance between high frequency signal lines and a grounding layer, poor control of additional parasitic capacitance between a contact pad mounting zone and a grounding layer, and mismatch of characteristic impedance of high frequency signal lines and a contact pad mounting zone.

Currently, various solutions have been proposed to overcome the problems of electromagnetic interference and impedance match in the length extension direction of high frequency signal lines of a flexible circuit board. However, up to date, due to constraints imposed by line widths of high frequency signal lines (the line widths being extremely small) and dimension specifications of signal terminal pins and components of a connector (which are relatively large as compared to the line widths of the signal lines), no manufacturer in this technical field has proposed an effective solution to ensure transmission quality of high frequency signals for a connection between high frequency signal lines and a contact pad mounting zone of a flexible circuit board and an adjacent site thereof.

SUMMARY OF THE INVENTION

Thus, an object of the present invention is to provide an attenuation reduction structure for high frequency signal contact pads of a circuit board, which comprises an increased thickness formed between high frequency signal contact pads and a grounding layer of a circuit board to increase a corresponding distance between the high frequency signal contact pads and the grounding layer, reducing reflection and loss of high frequency components of transmitted signals, thereby improving signal transmission quality of high frequency signal lines of the flexible circuit board.

The technical solution that the present invention adopts to overcome the problems of the prior art comprises an expanded thickness formed between high frequency signal contact pads and a grounding layer of a circuit board. The expanded thickness is greater than a reference thickness between the grounding layer and high frequency signal lines.

In a preferred embodiment of the present invention, the circuit board is a single-layer circuit board, or alternatively a multi-layered board formed by combining at least two single-layer circuit boards. A thickness-expanding pad is interposed between a contact pad mounting section of a first substrate and an opposite section of a second substrate.

In another embodiment of the present invention, a thickness-expanding pad is mounted between the high frequency signal contact pads and the grounding layer of the circuit board or alternatively, the thickness of a portion of a bonding layer of the circuit board is increased so as to provide an expanded thickness.

In another embodiment of the present invention, the circuit board comprises an extended grounding layer mounted to the grounding line mounting surface to correspond to the contact pad mounting section, the extended grounding layer being electrically connected to the grounding layer; and a thickness-expanding pad, which is connected between the grounding line mounting surface and the extended grounding layer of the circuit board.

The circuit board according to the present invention may comprises at least one inspection hole formed therein for observing and identifying if the thickness-expanding pad is properly set in position. Further, the circuit board according to the present invention may be further provided with a reinforcement plate mounted thereto.

The grounding layer of the circuit board of the present invention may further comprise an anti-attenuation pattern. The anti-attenuation pattern comprises a plurality of opening structures spaced from each other by predetermined distances.

The efficacy of the present invention is that with at least one thickness-expanding pad being mounted in a circuit board or the thickness of a bonding layer being partly expanded, during transmission of high frequency signals through high frequency signal lines, the capacitance effect induced by the high frequency signal lines is reduced so as to reduce the chance of transmission failure of high frequency differential mode signals and ensure the transmission quality of high frequency signals.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
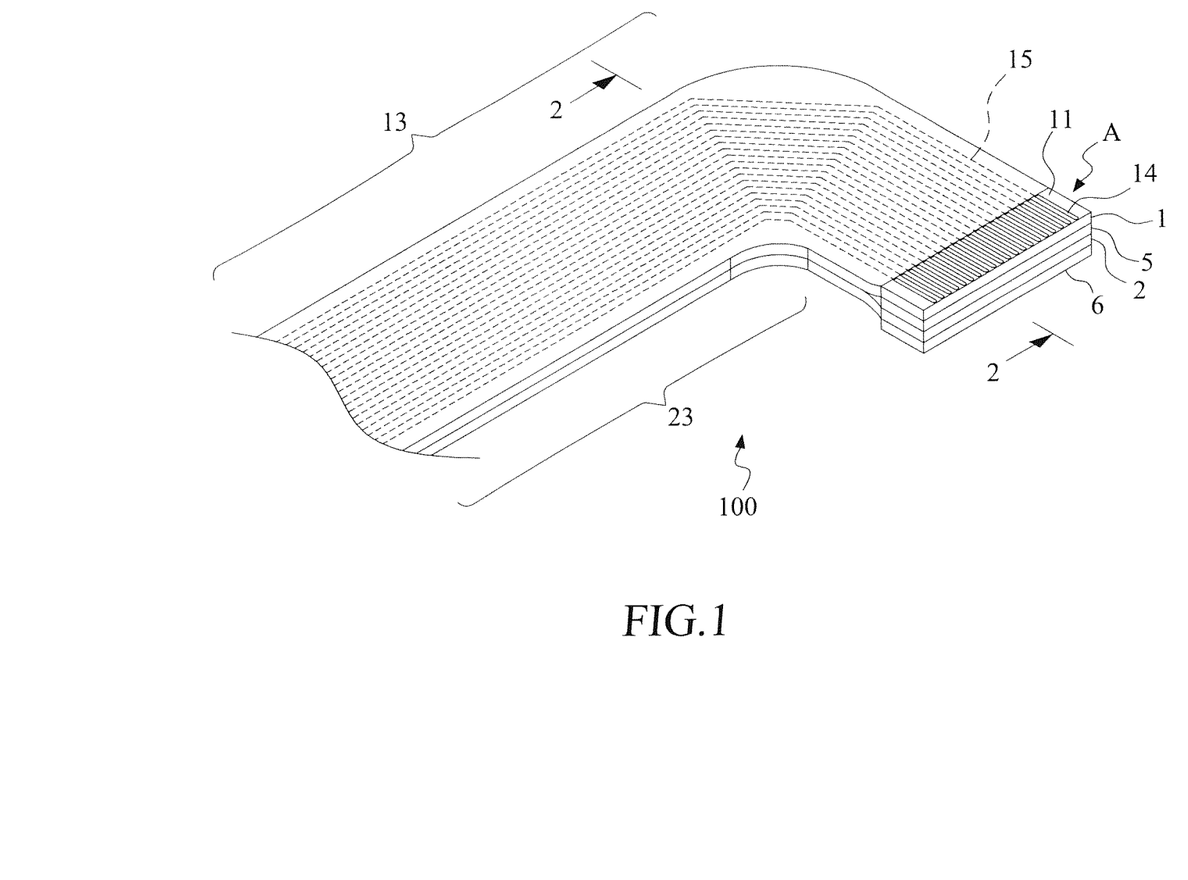
FIG. 1 is a perspective view showing an attenuation reduction structure of circuit board high frequency signal contact pads according to a first embodiment of the present invention.
Figure 2:
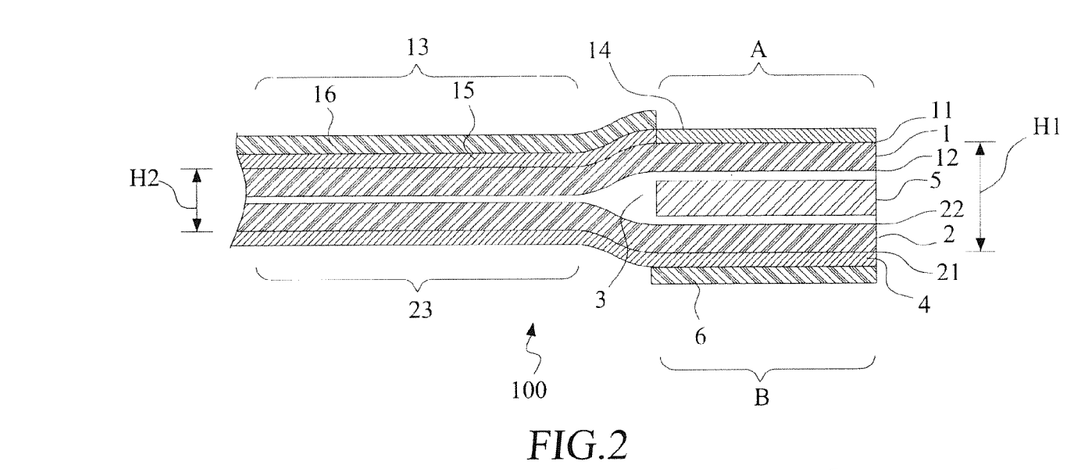
FIG. 2 is a cross-sectional view taken along line 2-2 of FIG. 1.

With reference to the drawings and in particular to FIGS. 1 and 2, a circuit board constructed in accordance with a first embodiment of the present invention, generally designated at 100, comprises a wiring mounting surface 11 and a grounding line mounting surface 21, a contact pad mounting section A formed on the wiring mounting surface 11, and an opposite section B that is opposite to the contact pad mounting section A. The circuit board 100 of the instant embodiment comprises, structurally, a first substrate 1, a second substrate 2, a bonding layer 3, a grounding layer 4, a plurality of high frequency signal contact pads 14, and a plurality of high frequency signal lines 15.

The first substrate 1 comprises the wiring mounting surface 11 and a first bonding surface 12. The wiring mounting surface 11 comprises the contact pad mounting section A defined thereon and a first extension section 13 extending from the contact pad mounting section A.

The plurality of high frequency signal contact pads 14 is mounted in the contact pad mounting section A of the first substrate 1 to be adjacent to and insulatively isolated from each other. The high frequency signal contact pads 14 are respectively connected to the plurality of high frequency signal lines 15 that are mounted on the wiring mounting surface 11 of the first substrate 1. The wiring mounting surface 11 of the first substrate 1 is covered by an insulation cover layer 16 set thereon.

The high frequency signal contact pads 14 comprise at least a pair of differential mode signal contact pads. The high frequency signal lines 15 that are connected to the high frequency signal contact pads 14 may carry and transmit differential mode signals.

The second substrate 2 comprises the grounding line mounting surface 21 and a second bonding surface 22. The second substrate 2 comprises the opposite section B defined thereon to correspond to and be opposite to the contact pad mounting section A of the first substrate 1 and a second extension section 23 corresponding to and opposite to the first extension section 13.

The bonding layer 3 is bonded between the first bonding surface 12 of the first substrate 1 and the second bonding surface 22 of the second substrate 2. The contact pad mounting section A of the first substrate 1 and the opposite section B of the second substrate are thus bonded to each other in a corresponding manner and the first extension section 13 and the second extension section 23 are also bonded to each other in a corresponding manner.

The grounding layer 4 is bonded to the grounding line mounting surface 21 of the second substrate 2. The high frequency signal lines 15 in the first extension section 13 of the first substrate 1 and the grounding layer 4 in the second extension section 23 of the second substrate 2 collectively define a reference thickness H2 therebetween. The grounding layer 4 has a bottom surface, which is provided, in the opposite section B, with a reinforcement plate 6 mounted thereto for reinforcement of an end portion of the circuit board 100 and adjustment of thickness.

A portion of the first bonding surface 12 located in the contact pad mounting section A of the first substrate 1 and a portion of the second bonding surface 22 located the opposite section B of the second substrate 2 receive at least one thickness-expanding pad 5 interposed therebetween. The thickness-expanding pad 5 provides an expanded thickness H1 between the high frequency signal contact pads 14 arranged in the contact pad mounting section A of the first substrate 1 and the portion of the grounding layer 4 located in the opposite section B of the second substrate 2. The expanded thickness H1 is greater than the reference thickness H2 between the high frequency signal lines 15 in the first extension section 13 of the first substrate 1 and the grounding layer 4 in the second extension section 23 of the second substrate 2.

Figure 3:
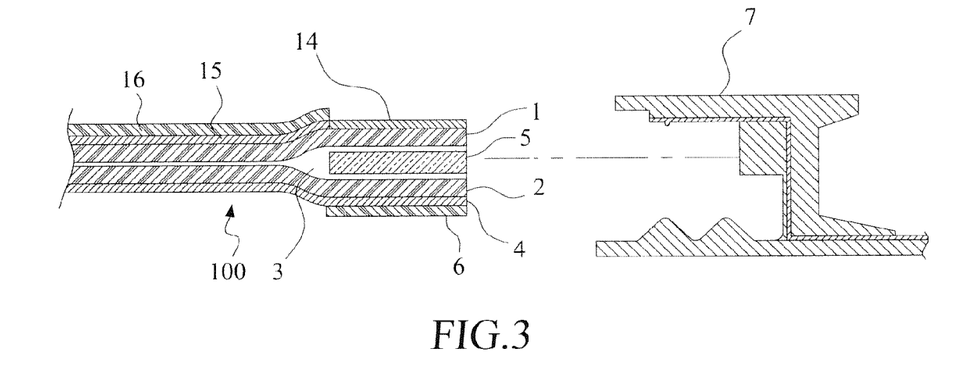
FIG. 3 is a cross-sectional view showing a combination of a circuit board and a connector according to the present invention.

Referring to FIG. 3, with the circuit board 100 combined with a connector 7, when the high frequency signal lines 15 transmit high frequency signals to have the high frequency signals transmitted through the connector 7 to an electronic device, by means of increasing the distance between the first substrate 1 and the second substrate 2 and inserting a thickness-expanding pad 5 therebetween, the capacitance effect induced by the high frequency signals transmitted through the high frequency signal lines 15 is reduced so as to reduce the chance of losing the high frequency differential mode signals and ensure the transmission quality of the high frequency signals.

Figure 4:
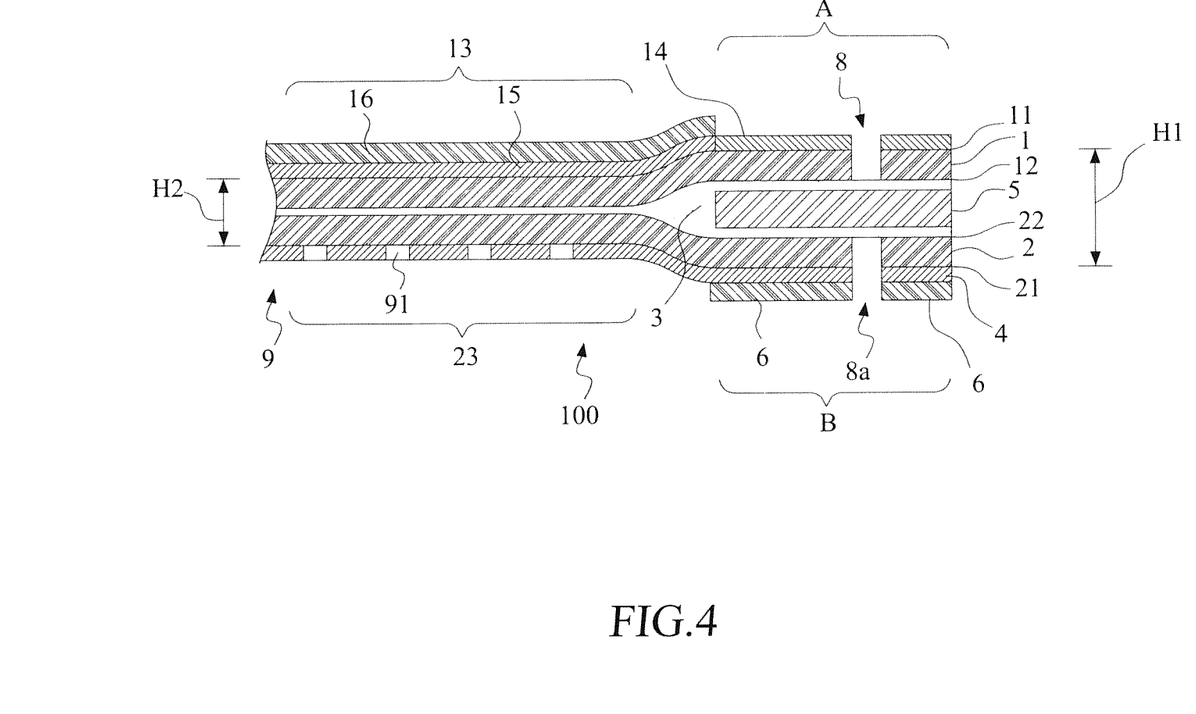
FIG. 4 is a cross-sectional view showing a second embodiment of the present invention.

Referring to FIG. 4, a second embodiment is shown, wherein at least one inspection hole 8 is formed in the wiring mounting surface 11 of the circuit board 100 within the contact pad mounting section A so as to expose at least a portion of a surface of the thickness-expanding pad 5 in the inspection hole 8. The inspection hole 8 allows an operator to observe and identify if the thickness-expanding pad 5 is properly inserted in position. Further, the circuit board 100 also comprises at least one inspection hole 8a formed in the grounding line mounting surface 21 within the opposite section B to expose at least a portion of a surface of the thickness-expanding pad 5 in the inspection hole 8a. The inspection hole 8a allows the operator to observe and identify if the thickness-expanding pad 5 is properly inserted in position.

Further, the grounding layer 4 may further comprise an anti-attenuation pattern 9 formed therein. The anti-attenuation pattern 9 comprises a plurality of opening structures 91 that is arranged to space from each other by predetermined distances. The opening structures 91 can be any geometric structure of a circular structure, a rectangular structure, and a rhombus structure. The anti-attenuation pattern 9 provides an effect of helping reduce attenuation of the high frequency signal.

Figure 5:
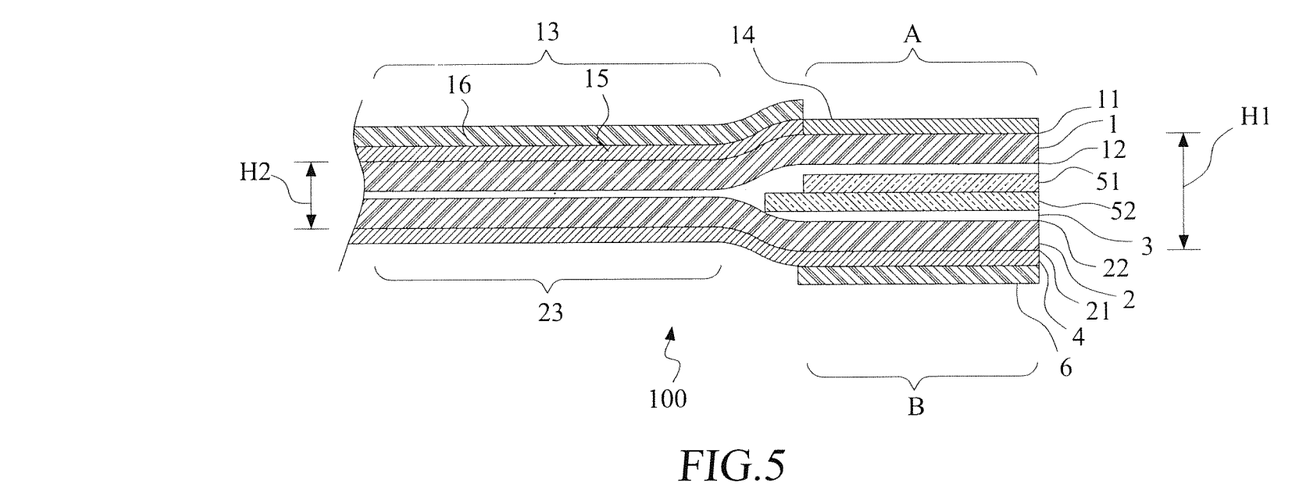
FIG. 5 is a cross-sectional view showing a third embodiment of the present invention.

Referring to FIG. 5, a cross-sectional view is given to illustrate a third embodiment of the present invention. The instant embodiment is substantially identical to the embodiment with reference to FIG. 2 and a difference is that a thickness-expanding pad comprises a first thickness-expanding pad 51 and at least one second thickness-expanding pad 52 stacked thereon and the second thickness-expanding pad 52 has a length different from a length of the first thickness-expanding pad 51 in order to match varying capacitance induced by a structure having a gradually decreasing area in the interconnection between the high frequency signal contact pads 14 and the corresponding high frequency signal lines 15.

Figure 6:
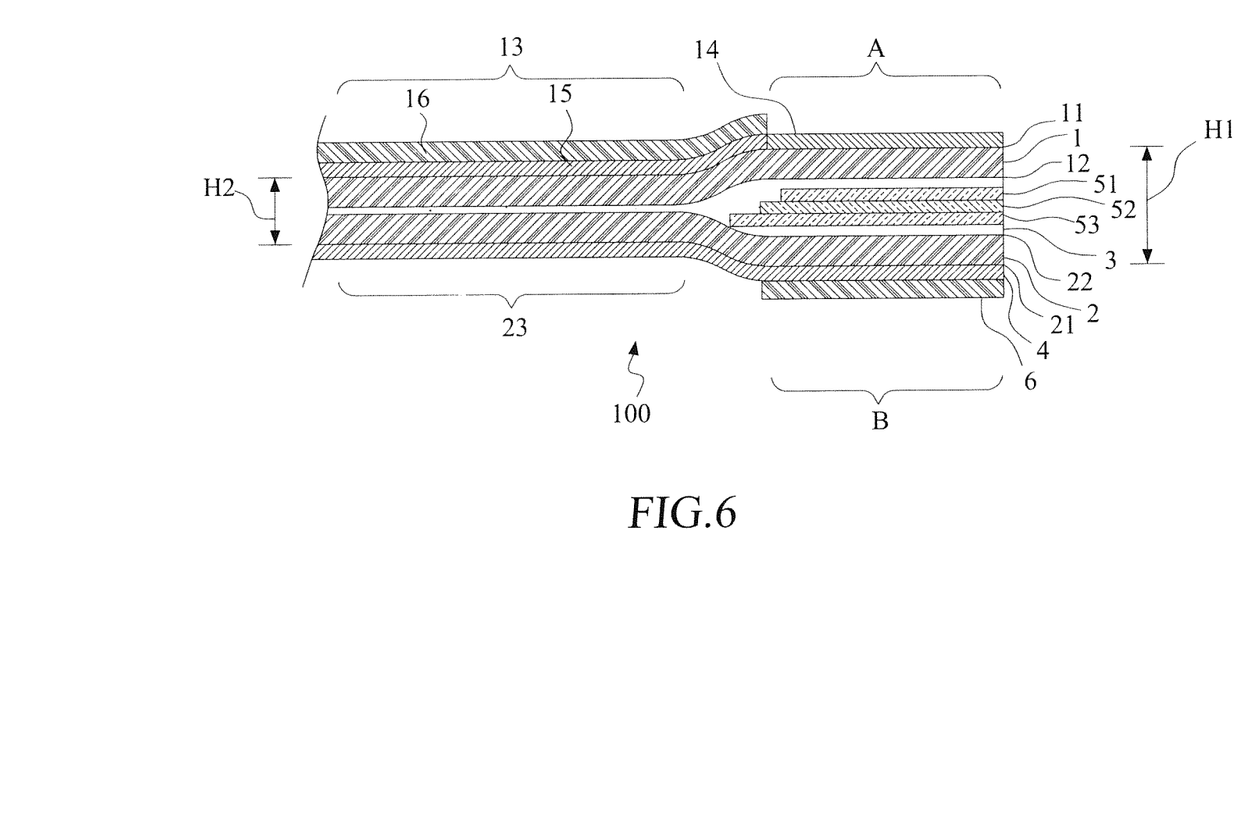
FIG. 6 is a cross-sectional view showing a fourth embodiment of the present invention.

Referring to FIG. 6, a cross-sectional view is given to illustrate a fourth embodiment of the present invention. The instant embodiment is substantially identical to the embodiment with reference to FIG. 5 and a difference is that a first thickness-expanding pad 51, a second thickness-expanding pad 52, and a third thickness-expanding pad 53 are provided and have different lengths in order to match varying capacitance induced by a structure having a gradually decreasing area in the interconnection between the high frequency signal contact pads 14 and the corresponding high frequency signal lines 15.

Figure 7:
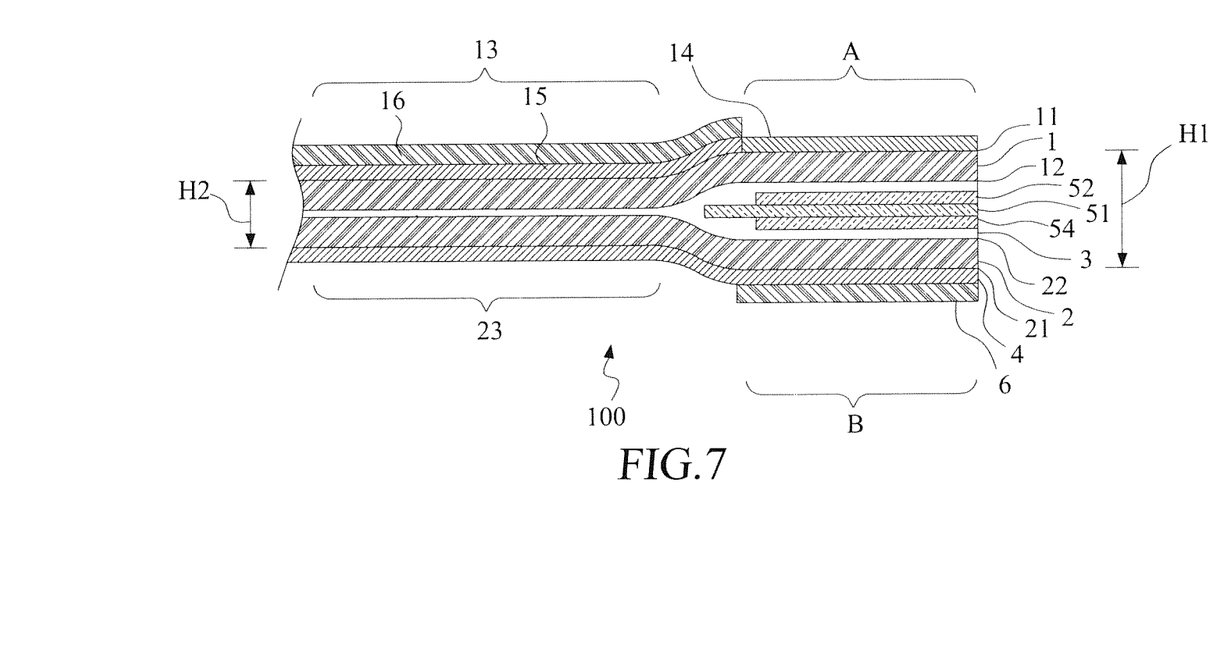
FIG. 7 is a cross-sectional view showing a fifth embodiment of the present invention.

FIG. 7 is a cross-sectional view illustrating a fifth embodiment of the present invention and showing the third thickness-expanding pad 53 of FIG. 6 is replaced with a fourth thickness-expanding pad 54 having a smaller length.

Figure 8:
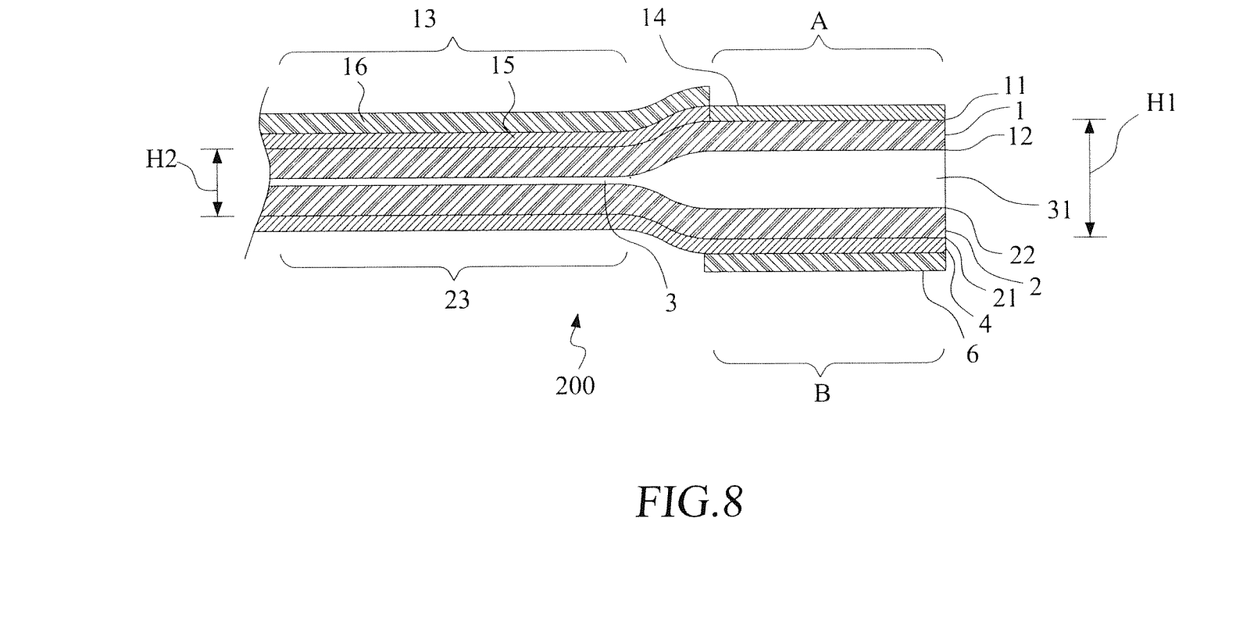
FIG. 8 is a cross-sectional view showing a sixth embodiment of the present invention.

Referring to FIG. 8, across-sectional view is given to illustrate a sixth embodiment of the present invention. The instant embodiment comprises components most of which are identical to those of the first embodiment and identical components are designated with the same reference numerals for consistency. In the instant embodiment, a first bonding surface 12 of a first substrate 1 of a circuit board 200 in a contact pad mounting section A and a second bonding surface 22 of a second substrate 2 in an opposite section B comprise a thickened bonding zone 31. The thickened bonding zone 31 has a thickness greater than a thickness of the bonding layer 3 between the first bonding surface 12 of the first substrate 1 in the first extension section 13 and the second bonding surface 22 of the second substrate 2 in the second extension section 23. The thickened bonding zone 31 provides an expanded thickness H1 between the high frequency signal contact pads 14 arranged in the contact pad mounting section A of the first substrate 1 and the grounding layer 4 in the opposite section B of the second substrate 2 and the expanded thickness H1 is greater than a reference thickness H2 between the high frequency signal lines in the first extension section of the first substrate and the grounding layer in the second extension section of the second substrate.

Figure 9:
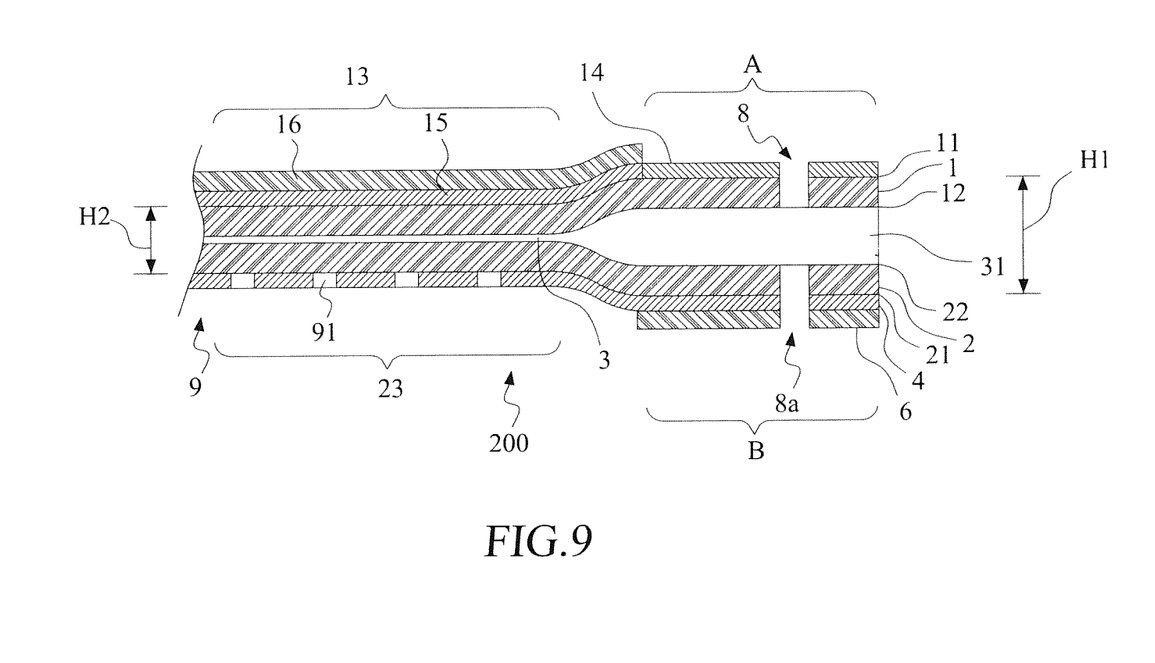
FIG. 9 is a cross-sectional view showing a seventh embodiment of the present invention.

Referring to FIG. 9, a cross-sectional view is given to illustrate a seventh embodiment of the present invention. The instant embodiment comprises components most of which are identical to those of the embodiment with reference to FIG. 8. In the instant embodiment, at least one inspection hole 8 is formed in a wiring mounting surface 11 of a circuit board 200 within a contact pad mounting section A so as to expose at least a portion of a surface of a thickened bonding zone 31 in the inspection hole 8. The inspection hole 8 allows an operator to observe the thickened bonding zone 31. Further, the circuit board 200 also comprises at least one inspection hole 8a formed in a grounding line mounting surface 21 within an opposite section B to expose at least a portion of a surface of the thickened bonding zone 31 in the inspection hole 8a. The inspection hole 8a allows the operator to observe the thickened bonding zone 31.

Figure 10:
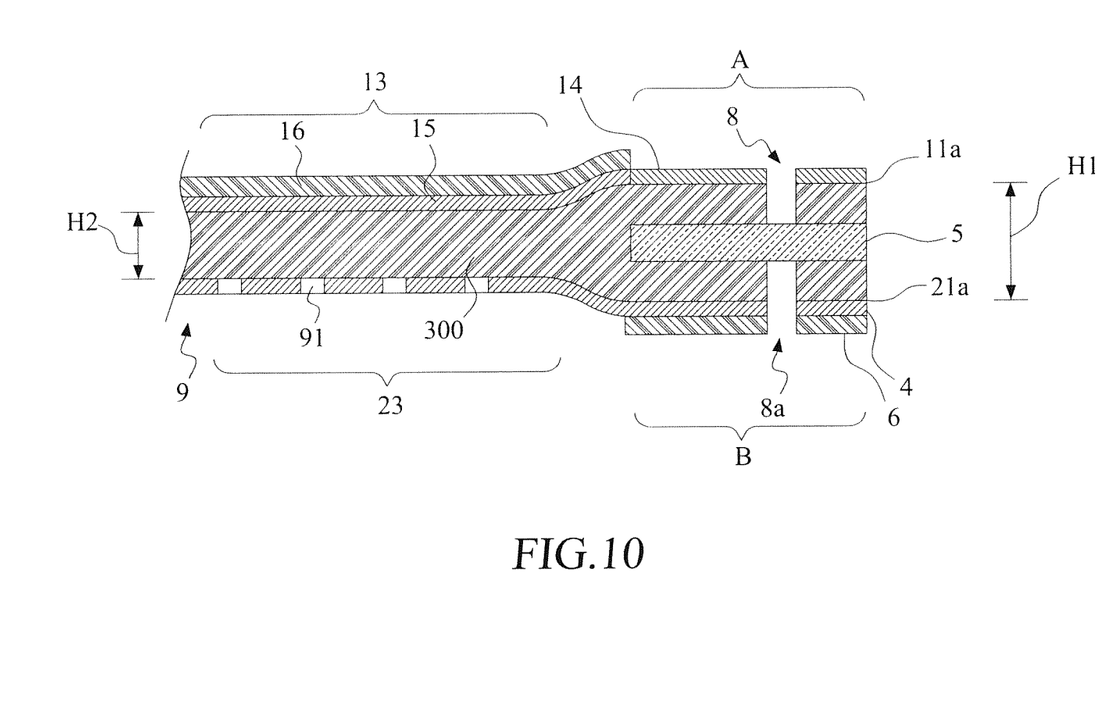
FIG. 10 is a cross-sectional view showing an eighth embodiment of the present invention.

Referring to FIG. 10, a cross-sectional view is given to illustrate an eighth embodiment of the present invention. The instant embodiment comprises components most of which are identical to those of the first embodiment and identical components are designated with the same reference numerals for consistency. A difference resides in that the circuit board 300 is a single-layer circuit board, wherein the circuit board 300 has a wiring mounting surface 11a which comprises a contact pad mounting section A defined thereon and an first extension section 13 extending from the contact pad mounting section A.

A plurality of high frequency signal contact pads 14 is mounted in the contact pad mounting section A of the wiring mounting surface 11a of the circuit board 300 to be adjacent to and insulatively isolated from each other. The wiring mounting surface 11a also comprises a plurality of high frequency signal lines 15 mounted thereon to respectively correspond to and connect with the high frequency signal contact pads 14.

The grounding line mounting surface 21a of the circuit board 300 comprises, defined thereon, an opposite section B corresponding to and opposite to the contact pad mounting section A and a second extension section 23 corresponding to the first extension section 13.

The contact pad mounting section A and the opposite section B of the circuit board 300 comprise at least one thickness-expanding pad 5 inserted and interposed therebetween. The thickness-expanding pad 5 provides an expanded thickness H1 between the high frequency signal contact pads 14 arranged in the contact pad mounting section A of the circuit board 300 and the portion of the grounding layer 4 located in the opposite section B of the circuit board 300. The expanded thickness H1 is greater than a reference thickness H2 between the high frequency signal lines 15 in the first extension section 13 of the circuit board 300 and the grounding layer 4 in the second extension section 23 of the circuit board 300. The thickness-expanding pad 5 similarly helps reduce the capacitance effect and reflection loss induced in the transmission of high frequency signals so as to reduce the chance of losing the high frequency differential mode signals and ensure the transmission quality of the high frequency signals.

In the instant embodiment, the circuit board 300 may also comprise at least one inspection hole 8 formed in the wiring mounting surface 11a within the contact pad mounting section A. And, the circuit board 200 may be additionally provided with at least one inspection hole 8a formed in the grounding line mounting surface 21 of the opposite section B.

Figure 11:
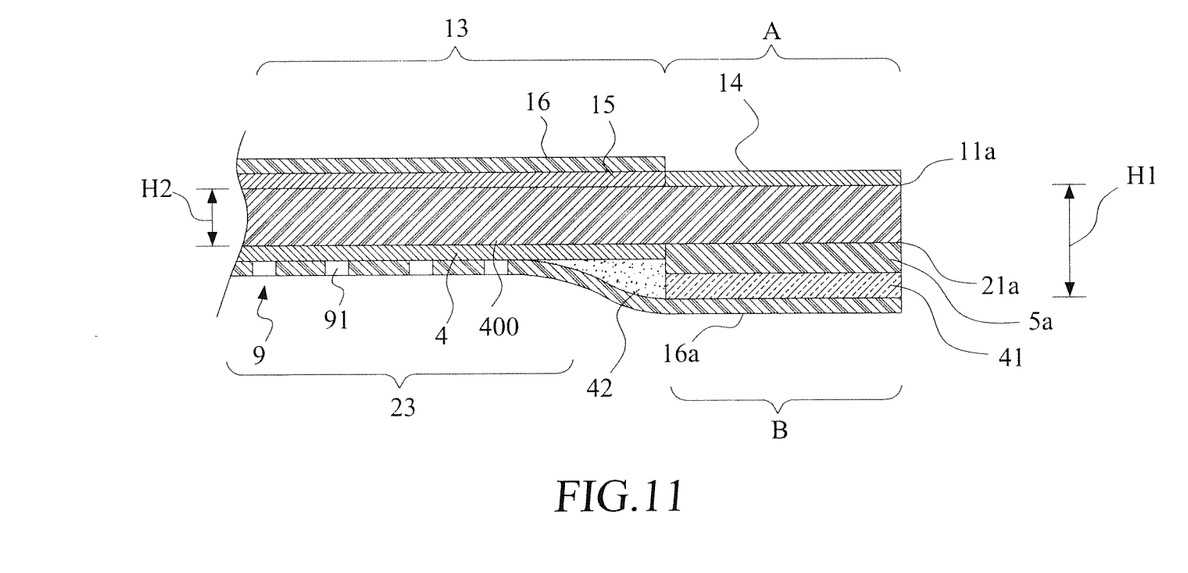
FIG. 11 is a cross-sectional view showing a ninth embodiment of the present invention.

Referring to FIG. 11, a cross-sectional view is given to illustrate a ninth embodiment of the present invention. The instant embodiment provides a circuit board 400, which is a single-layer circuit board, wherein the circuit board 400 comprises a wiring mounting surface 11a that defines a contact pad mounting section A and a first extension section 13 extending from the contact pad mounting section A.

A plurality of high frequency signal contact pads 14 is mounted in the contact pad mounting section A of the wiring mounting surface 11a of the circuit board 400 to be adjacent to and insulatively isolated from each other. The wiring mounting surface 11a also comprises a plurality of high frequency signal lines 15 mounted thereon to respectively correspond to and connect with the high frequency signal contact pads 14.

The grounding line mounting surface 21a of the circuit board 400 comprises, defined thereon, an opposite section B corresponding to and opposite to the contact pad mounting section A and a second extension section 23 corresponding to the first extension section 13.

A grounding layer 4 is formed on the circuit board 400 in the second extension section 23. The grounding layer 4 does not extend into the opposite section B. The grounding line mounting surface 21a of the circuit board 400 is first connected, in the opposite section B, to at least one thickness-expanding pad 5a and then, the thickness-expanding pad 5a is connected, at a bottom surface thereof, to an extended grounding layer 41. The extended grounding layer 41 is set in electrical connection with the grounding layer 4 through a conductive material 42 (such as silver paste, copper paste, and solder). Finally, an insulation cover layer 16a is formed on the bottom of the grounding layer 4 and the extended grounding layer 41.

With the arrangement of the extended grounding layer 41 and the thickness-expanding pad 5a, similarly, an expanded thickness H1 is formed between the high frequency signal contact pads 14 formed in the contact pad mounting section A of the circuit board 400 and the grounding layer 41 of the circuit board 400 in the opposite section B and the expanded thickness H1 is greater than a reference thickness H2 between the high frequency signal lines 15 of the circuit board 400 in the first extension section 13 and the grounding layer 4 of the circuit board 400 in the second extension section 23 so as to help reduce the capacitance effect and reflection loss in transmission of high frequency signals thereby reducing the chance of losing the high frequency signals and ensuring the transmission quality of the high frequency signals.

In each of the embodiments illustrated previously, the circuit board can be one of a flexible circuit board, a rigid board, and a rigid-flex board. The flexible circuit board can be made of a material of one of polyethylene terephthalate (PET) and polyimide (PI). The rigid board can be made of a material that comprises a mixture of a resin and a fibrous material in a predetermined ratio. The rigid-flex board can be a combined structure of a flexible circuit board and a rigid.

Further, in the drawings associated with the previous embodiments, illustration is given to an example where the high frequency signal contact pads are arranged at an end portion of the circuit board. Those skilled in the art may readily appreciate that the present invention is equally applicable to examples where the high frequency signal contact pads are formed at any location in the circuit board and the high frequency signal contact pads may serve as soldering pads of terminal pins of an electronic device.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An attenuation reduction structure for a circuit board having a wiring mounting surface and a grounding line mounting surface, a contact pad mounting section being defined on the wiring mounting surface of the circuit board, comprising:
   a plurality of high frequency signal contact pads formed on the contact pad mounting section to be adjacent to and insulatively isolated from each other;
   at least one high frequency signal line formed on the wiring mounting surface of the circuit board and electrically connected to the high frequency signal contact pads; and
   a grounding layer, which is formed on the grounding line mounting surface of the circuit board, the grounding layer and the high frequency signal lines having a reference thickness therebetween;
   wherein the circuit board has an expanded thickness between the high frequency signal contact pads and the grounding layer and the expanded thickness is greater than the reference thickness.

2. The attenuation reduction structure as claimed in claim 1, wherein the circuit board is made of a material that is one of flexible materials including polyethylene terephthalate (PET) and polyimide (PI).

3. The attenuation reduction structure as claimed in claim 1, wherein the circuit board is made of a material comprising resin and fibrous material.

4. The attenuation reduction structure as claimed in claim 1, wherein the circuit board comprises at least one thickness-expanding pad interposed between the high frequency signal contact pads and the grounding layer.

5. The attenuation reduction structure as claimed in claim 1, wherein the circuit board comprises:
   a first substrate, which has a surface serving as the wiring mounting surface and an opposite surface forming a first bonding surface, the wiring mounting surface comprising a first extension section extending from the contact pad mounting section; and
   a second substrate, which has a surface serving as the grounding line mounting surface and an opposite surface forming a second bonding surface, the second substrate comprising an opposite section corresponding to and opposite to the contact pad mounting section of the first substrate and a second extension section corresponding to the first extension section;
   wherein the contact pad mounting section of the first substrate and the opposite section of the second substrate are bonded and the first extension section and the second extension section are bonded; and
   a thickness-expanding pad, which is interposed between the contact pad mounting section of the first substrate and the opposite section of the second substrate.

6. The attenuation reduction structure as claimed in claim 5, wherein the first bonding surface of the first substrate and the second bonding surface of the second substrate are bonded to each other with a bonding layer therebetween.

7. The attenuation reduction structure as claimed in claim 1, wherein the circuit board comprises:
   a first substrate, which has a surface serving as the wiring mounting surface and an opposite surface forming a first bonding surface, the wiring mounting surface comprising a first extension section extending from the contact pad mounting section;
   a second substrate, which has a surface serving as the grounding line mourning surface and an opposite surface forming a second bonding surface, the second substrate comprising an opposite section corresponding to and opposite to the contact pad mounting section of the first substrate and a second extension section corresponding to the first extension section; and
   a bonding layer, which is arranged to bond between the first bonding surface of the first substrate and the second bonding surface of the second substrate to have the contact pad mounting section of the first substrate and the opposite section of the second substrate bonded together and the first extension section and the second extension section bonded together;
   wherein the bonding layer comprises a thickened bonding zone between the contact pad mounting section of the first substrate and the opposite section of the second substrate, the thickened bonding zone having a thickness greater than a thickness between the first extension section of the first substrate and the second extension section of the second substrate; and the thickened bonding zone provides the expanded thickness between the high frequency signal contact pads arranged in the contact pad mounting section of the first substrate and the grounding layer in the opposite section of the second substrate and the expanded thickness is greater than the reference thickness between the high frequency signal lines of the first substrate in the first extension section and the grounding layer of the second substrate in the second extension section.

8. The attenuation reduction structure as claimed in claim 1, wherein the circuit board comprises an extended grounding layer mounted to the grounding line mounting surface to correspond to the contact pad mounting section, the extended grounding layer being electrically connected to the grounding layer; and a thickness-expanding pad connected between the grounding line mounting surface and the extended grounding layer of the circuit board.

9. The attenuation reduction structure as claimed in claim 1, wherein the circuit board comprises at least one inspection hole formed in the wiring mounting surface within the contact pad mounting section, a thickness-expanding pad having a surface having at least a portion that is exposed in the inspection hole.

10. The attenuation reduction structure as claimed in claim 1, wherein the circuit board comprises at least one inspection hole formed in the grounding line mounting surface within the opposite section, a thickness-expanding pad having a surface having at least a portion that is exposed in the inspection hole.

11. The attenuation reduction structure as claimed in claim 1, wherein the grounding layer comprises a reinforcement plate mounted thereto within the contact pad mounting section.

12. The attenuation reduction structure as claimed in claim 1, wherein a thickness-expanding pad comprises:
   a first thickness-expanding pad; and
   at least one second thickness-expanding pad, which is stacked on the first thickness-expanding pad, the at least one second thickness-expanding pad having a length that is different from a length of the first thickness-expanding pad.

13. The attenuation reduction structure as claimed in claim 1, wherein the high frequency signal contact pads comprises at least a pair of differential mode signal contact pads.

14. The attenuation reduction structure as claimed in claim 1, wherein the grounding layer further comprises an anti-attenuation pattern, the anti-attenuation pattern comprising a plurality of opening structures spaced from each other by predetermined distances.

* * * * *